(12) United States Patent
Blumschein et al.

(10) Patent No.: US 10,777,992 B2
(45) Date of Patent: Sep. 15, 2020

(54) METHOD AND PROTECTION DEVICE FOR MONITORING CIRCUIT BREAKER IN AN ELECTRICAL POWER SUPPLY NETWORK

(71) Applicant: SIEMENS AKTIENGESELLSCHAFT, Munich (DE)

(72) Inventors: Joerg Blumschein, Berlin (DE); Olaf Neugebauer, Bergfelde (DE); Yilmaz Yelgin, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 545 days.

(21) Appl. No.: 15/353,868

(22) Filed: Nov. 17, 2016

(65) Prior Publication Data

US 2017/0141559 A1    May 18, 2017

(30) Foreign Application Priority Data

Nov. 17, 2015   (EP) .................................... 15194882

(51) Int. Cl.
 *H02H 3/08* (2006.01)
 *H02H 9/02* (2006.01)
 (Continued)

(52) U.S. Cl.
 CPC ........... *H02H 3/04* (2013.01); *G01R 31/3275* (2013.01); *G01R 31/3333* (2013.01); *H02H 3/05* (2013.01);
 (Continued)

(58) Field of Classification Search
 CPC ......... H02H 3/04; H02H 3/05; G01R 31/3333
 (Continued)

(56) References Cited

U.S. PATENT DOCUMENTS 5,157,575 A   10/1992 Feltis et al.
5,710,542 A    1/1998 Jurisch
(Continued)

FOREIGN PATENT DOCUMENTS

BY        8583 C1   10/2006
CN     1171612 A    1/1998
(Continued)

OTHER PUBLICATIONS

Jiang, Yu, et al.: "The Optimization of 500kV Breaker Failure Protection", 2014 China International Conference on Electricity Distribution (CICED 2014), Shenzhen, Sep. 23-26, 2014, pp. 1755-1558; 2014.

*Primary Examiner* — Jared Fureman
*Assistant Examiner* — Lucy M Thomas
(74) *Attorney, Agent, or Firm* — Laurence Greenberg; Werner Stemer; Ralph Locher (57) ABSTRACT

A method monitors a circuit breaker in an electrical power supply network, in which one section of the electrical power supply network is monitored in respect of the occurrence of a fault. Upon detection of a fault in the monitored section, a trigger signal is output to a circuit breaker bordering the section, and a switch-fault signal indicating a fault upon opening the circuit breaker is generated if a continuous current flow through the circuit breaker is detected after the trigger signal is output. In order to provide for a preferably rapid and reliable detection of a continuous current flow or an interruption of the current flow during the monitoring of a circuit breaker, it is provided that a curve shape of the time curve of the instantaneous current flowing through the circuit breaker is investigated in order to detect a continuous current flow.

10 Claims, 5 Drawing Sheets

(51) Int. Cl.
  *H02H 3/04*     (2006.01)
  *G01R 31/327*   (2006.01)
  *G01R 31/333*   (2006.01)
  *H02H 3/05*     (2006.01)
  *H01H 33/59*    (2006.01)
  *H01H 9/54*     (2006.01)

(52) U.S. Cl.
  CPC ............... *H01H 9/54* (2013.01); *H01H 33/59* (2013.01); *H02H 3/044* (2013.01)

(58) Field of Classification Search
  USPC ............................................ 361/2, 42, 93.1
  See application file for complete search history.

(56) References Cited

U.S. PATENT DOCUMENTS

| | | | |
|---|---|---|---|
| 5,828,540 A | 10/1998 | Marmonier et al. | |
| 5,914,663 A | 6/1999 | Whitehead | |
| 2004/0047097 A1* | 3/2004 | Thomas Jordan | G01R 31/3278 361/92 |
| 2005/0066940 A1* | 3/2005 | Sheikh | F02D 41/20 123/446 |
| 2007/0222427 A1* | 9/2007 | Takeuchi | G01R 31/043 324/71.2 |
| 2008/0019063 A1* | 1/2008 | Muller | H01H 9/56 361/42 |
| 2008/0106833 A1 | 5/2008 | Lewinski et al. | |
| 2008/0165461 A1 | 7/2008 | Paik et al. | |
| 2013/0107405 A1 | 5/2013 | Blumschein et al. | |
| 2013/0229186 A1 | 9/2013 | Shiraishi et al. | |

FOREIGN PATENT DOCUMENTS

| | | |
|---|---|---|
| CN | 1132130 C | 12/2003 |
| CN | 103296715 A | 9/2013 |
| CN | 104407286 A | 3/2015 |
| DE | 69728475 T2 | 3/2005 |
| JP | 2010515976 A | 5/2010 |
| RU | 2333583 C1 | 9/2008 |
| RU | 2529773 C1 | 9/2014 |
| WO | 9921146 A1 | 4/1999 |

\* cited by examiner

METHOD AND PROTECTION DEVICE FOR MONITORING CIRCUIT BREAKER IN AN ELECTRICAL POWER SUPPLY NETWORK

CROSS-REFERENCE TO RELATED APPLICATION

This application claims the priority, under 35 U.S.C. § 119, of European application EP15194882, filed Nov. 17, 2015; the prior application is herewith incorporated by reference in its entirety.

BACKGROUND OF THE INVENTION

Field of the Invention

The invention relates to a method for monitoring a circuit breaker in an electrical power supply network, in which one section of the electrical power supply network is monitored in respect of the occurrence of a fault and, upon detection of a fault in the monitored section, a trigger signal is output to a circuit breaker bordering the section, and a switch-fault signal indicating a fault upon opening the circuit breaker is generated if a continuous current flow through the circuit breaker is detected after the trigger signal is output.

The invention also relates to a protection device for monitoring a circuit breaker, which device has a similarly configured control device.

Electrical power supply networks are usually monitored in respect of their operating state by so-called protection devices. Such protection devices utilize so-called protection algorithms (e.g. distance protection algorithms, differential protection algorithms, over current protection algorithms) in order to evaluate measured values (e.g. currents and/or voltages) which indicate an operating state of the power supply network at a particular measuring point. As the result of the evaluation, a protection device reaches a decision as to whether the section of the power supply network it monitors is in a permissible or impermissible operating state. If an impermissible operating state—which can be caused, for example, by a present short circuit—is detected, the protection device outputs a trigger signal to a circuit breaker, which borders the faulty section of the power supply network, in order to prompt the circuit breaker to open its switch contacts and therefore disconnect the faulty section from the rest of the power supply network.

In this case, it must be ensured that the circuit breaker also actually shuts down the section, since components of the power supply network can become damaged otherwise. In addition, persons are at risk of injury if a fault is not disabled.

Therefore, the protection devices themselves or separate devices usually carry out a so-called circuit-breaker failure protection function which monitors the proper opening of a circuit breaker after a trigger signal is output. If the shutdown cannot be carried out, e.g., due to a defective circuit breaker or a faulty transmission of the trigger signal, the circuit-breaker failure protection function carries out suitable measures in order to bring about a safe state of the faulty section of the power supply network. Such measures can consist of a renewed attempt to open the circuit breaker. In addition, further circuit breakers which are suitable for shutting down the faulty section can also be activated.

The circuit-breaker failure protection function must be capable of very quickly reaching a decision as to whether the circuit breaker has correctly reacted to the trigger signal in order to secure the stability of the network. This requires a rapid and reliable detection of whether the circuit breaker has actually interrupted the current flow. It must be ensured that a malfunction of the circuit breaker can be detected only if there is a continuous current flow through the circuit breaker, since, otherwise, there is a risk of an unnecessary shutdown of further parts of the power supply network. For this purpose, either auxiliary contacts of the circuit breaker can be monitored or the current flow through the circuit breaker can be monitored by measuring.

The presentation "The Optimization of 500 kV Breaker Failure Protection"; Jiang, Y. et al, 2014 China International Conference on Electricity Distribution (CICED 2014), Shenzhen, 23-26 Sep. 2014 makes known a method for monitoring a circuit breaker, in which, in order to detect whether a continuous current flow is taking place through the circuit breaker, a current signal is initially transformed into the frequency range by use of a Fourier transformation and is then analyzed. The transformation into the frequency range extends the period of time within which a decision regarding the correction function of the circuit breaker can be reached.

In addition, U.S. Pat. No. 5,157,575 A also makes known a method for monitoring a circuit breaker, in which a continuous current flow is detected by an over current element which compares the current flowing through the circuit breaker with a threshold value. In order to enable a reliable finding regarding the state of the circuit breaker to be obtained even in the case of direct-current components which decay slowly, relatively long investigation periods must be set in this case, whereby the method becomes slower overall.

SUMMARY OF THE INVENTION

The problem addressed by the invention is that of preferably rapidly and reliably detecting a continuous current flow or an interruption in the current flow during the monitoring of a circuit breaker.

This problem is solved by a method of the type mentioned at the outset, in which a curve shape of the time curve of the instantaneous current flowing through the circuit breaker is investigated in order to detect a continuous current flow.

Given that the time curve of the instantaneous current is considered, i.e., an analysis takes place in the time range, in the method according to the invention, a time-consuming and computationally complex Fourier transformation can be dispensed with. Due to the consideration of the progression of the instantaneous current, the curve shape is also evaluated, and so, as a result, a substantially more flexible evaluation of the current flow can take place than is the case if a simple threshold comparison is utilized. One further advantage of the method according to the invention is that, when implemented in practice, the sampling rate to be utilized for detecting the instantaneous current can be selected so as to be relatively low. In this way, a sampling rate of approximately 1 kHz is considered to be sufficient for detecting the instantaneous current; methods which operate in the frequency range frequently require substantially higher sampling rates which can lie at values of over 3 kHz.

In this case, the investigation can take place on the basis of a particular phase current, a ground current, or a negative sequence system current.

According to one advantageous embodiment of the method according to the invention, it can be provided that the curve shape of the time curve of the instantaneous current flowing through the circuit breaker is investigated in respect of the presence of at least one criterion characterizing the curve shape and, on the basis of the criterion, a continuous current flow or an interrupted current flow is deduced.

In this way, advantageously, one or multiple characteristic properties of the instantaneous current-progression can be considered and evaluated in respect of the question as to whether a continuous current flow is present or whether the current flow has been interrupted as desired. In the progression of the instantaneous current, criteria which infer a current interruption as well as criteria which indicate a continuous current flow can be considered. The latter are required in order to avoid false-positive conclusions when typical phenomena occur in the instantaneous current-progression, such as, e.g., saturation, the occurrence of harmonic overtones, etc.

Specifically, in this context, it can be provided according to one advantageous refinement of the method according to the invention that a periodicity of the progression is investigated as the criterion and a continuity of the current flow through the circuit breaker is deduced when a periodicity of the progression is detected.

This advantageous refinement is based on the finding that a periodicity of an instantaneous current-progression is usually present only if the current flow has not been interrupted. Therefore, by investigating the progression in respect of a periodicity, a continuous current flow can be relatively easily deduced. A present periodicity can also be relatively quickly established, since features which indicate a periodicity occur already within ¼ period in the case of common sinusoidal signals.

In this context, it can be advantageously provided that the periodicity of the progression is investigated on the basis of local extremes and/or inflection points which occur.

Such features make it possible to relatively reliably and rapidly detect a present periodicity. In addition, such features can be easily determined by forming the first and, if necessary, the second and third derivatives of the progression, or by calculating the corresponding difference quotient.

According to one further advantageous refinement of the method according to the invention, in the absence of a periodicity of the progression, a decay behavior of the progression is investigated as one further criterion, and an interruption of the current flow through the circuit breaker is deduced when decay behavior of the progression is detected.

In this way, a curve shape of the progression, which indicates an interruption of the current flow, can be detected relatively quickly. If a current flow is interrupted via the contacts of a circuit breaker, a periodicity is frequently no longer present and the progression of the measured instantaneous current continuously decays due to discharge processes.

In this context, it can be provided that the mean value of the progression of the instantaneous current and the gradient of the progression of the instantaneous current are investigated in order to detect a decay behavior and, in the case of a positive mean value and a negative gradient or a negative mean value and a positive gradient, the presence of a decay behavior is deduced.

Due to the consideration of these easily determined features of the progression of the instantaneous current, a reliable differentiation of curve shapes of the progression caused by a saturation of the current transformers can also take place. That is, if current transformer saturation is present, a positive mean value in combination with a positive gradient (and vice versa) is present.

According to one further advantageous refinement of the method according to the invention, it is also provided that an amplitude of the progression is determined as a further criterion, and an interruption of the current flow through the circuit breaker is deduced when the amplitude of the progression exceeds an amplitude threshold value.

That is, a relatively small amplitude of the progression can likewise infer the presence of an interruption of the current flow.

Specifically, it can be provided in this context that the amplitude is determined as a peak-to-peak amplitude of the progression.

The peak-to-peak amplitude or the signal deviation allows for a relatively reliable determination of the amplitude of the signal even in the case of progressions which are not completely sinusoidal or in the case of superimposition of the progression with a direct-current component.

In addition, according to one further advantageous embodiment, it can be provided in this context that an interruption of the current flow can also be deduced in the case of an amplitude of the progression, which lies below the amplitude threshold value, when a periodicity of the progression has been detected.

As a result, the amplitude criterion can be established as a priority criterion for assessing the progression of the instantaneous current. In an investigation of the current flow, a progression of the instantaneous current having a substantially reduced amplitude in combination with a curve shape which is still periodic can also occur.

According to one further advantageous embodiment of the method according to the invention, the progression is investigated within a predefined time window, wherein the length of the time window is adaptively determined.

The length of the time window determines the speed at which a decision can be reached regarding a continuous current flow or an interruption of the current flow. For this purpose, the time window should be configured to be as short as possible. On the other hand, the time window must also be selected to be so long that a decision can be reached with the necessary level of reliability. In the event that overtones occur, for example, a flat progression of the instantaneous current, i.e., a non-periodic progression having a low amplitude, can also occur for relatively long periods of time (e.g., in the range of one-half of a period) in the event of a continuous current flow, which progression could be assessed as an interruption of the current flow if a time window which is too short is selected. The utilization of a time window having an adaptive length makes it possible to satisfy both requirements, i.e., speed and reliability.

In this context, it can be specifically provided that, in order to adaptively determine the length of the time window, the investigation is initially started with a minimum length of the time window, and the length of the time window is increased for as long as an interruption of the current flow is detected during a learning phase immediately following the point in time at which the shutoff signal is output, wherein the duration of the learning phase is determined depending on the reaction time of the circuit breaker.

In this advantageous embodiment, use is advantageously made of the finding that, immediately after the trigger signal is output and up to the actual triggering of the switch, a switch-specific reaction time passes, within which the current flow may have not yet been interrupted. Therefore, if an interruption of the current flow is detected on the basis of the aforementioned criteria within a learning phase having a duration determined in this manner, this interruption can only be due to a selection of the length of the time window, which was too short in respect of the special progression of the instantaneous current. The time window must therefore be extended accordingly until an interruption of the current flow is no longer detected. This adaptation of the time window must be completed, however, within the reaction time of the circuit breaker, which is typically, for example, 50 ms (2.5 periods in the case of a nominal frequency of 50 Hz), and so the increments by which the length of the time window is extended must be dimensioned accordingly.

According to one further advantageous embodiment of the method according to the invention, it can be provided that the investigation of the curve shape of the progression is carried out repeatedly during one maximum investigation period, and the switch-fault signal is generated when a continuous current flow is determined at the end of the maximum investigation period.

As a result, the reliability of the detection can be further increased, since the final decision regarding the detection of a continuous or interrupted current flow is reached at the end of the maximum investigation period and, therefore, on the basis of multiple investigation runs and not on the basis of a single investigation. The maximum investigation period should be configured to be so long that a current interruption usually can be identified in the case of a fault-free circuit breaker, and so short that damage cannot occur to the power supply network or to persons.

In this context, according to one further advantageous embodiment of the method according to the invention, it can be provided that the selection of the criteria to be considered for the investigation of the progression depends on whether an interruption of the current flow has already been detected in a previous run of the investigation.

In this way, a simplified investigation process can be utilized after a current flow interruption is detected, in which process a reduced number of criteria is considered in order to assess the progression. The full scope of all criteria can be implemented again, however, if the presence of a current flow is detected again.

Finally, according to one further advantageous embodiment of the method according to the invention, if a switch-fault signal is present, a new trigger signal is output to the circuit breaker and/or an auxiliary trigger signal is output to at least one further circuit breaker installed upstream from the circuit breaker.

In this manner, the faulty section of the power supply network can be reliably shut down even if the circuit breaker is not opened. In this way, a second opening attempt can be carried out by a renewed output auxiliary of the shutoff signal to the circuit breaker. Alternatively or additionally, an trigger signal can also be output to upstream circuit breakers in order to reliably shut down the faulty section. The auxiliary trigger signal can also be output with a temporal delay relative to the new trigger signal for the local circuit breaker, in order to favorably affect the local clarification of the fault.

The aforementioned problem is also solved by a protection device for monitoring a circuit breaker in an electrical power supply network. The protection device contains a control device which is configured for generating a switch-fault signal indicating a fault which occurs during the opening of a circuit breaker when a continuous current flow through the circuit breaker is detected after the trigger signal for the circuit breaker is output.

According to the invention, it is provided that the control device is configured for investigating a curve shape of the time curve of the instantaneous current flowing through the circuit breaker in order to detect a continuous current flow.

The protection device can be an integral component of a protection unit which monitors a section of the power supply network bordered by the circuit breaker and, in the event of a fault, outputs the trigger signal to the circuit breaker. Alternatively, the protection device can also be a separate device.

With respect to the protection device according to the invention, all of the comments presented in the preceding and in the following regarding the method according to the invention apply similarly, and vice versa; in particular, the protection device according to the invention is configured for carrying out the method according to the invention in any type of embodiment or in a combination of any type of embodiments. Reference is also made to the described advantages of the method according to the invention in respect of the advantages of the protection device according to the invention.

The invention is described in greater detail in the following with reference to one exemplary embodiment. The specific embodiment of the exemplary embodiment is not intended to be restrictive in any way for the general embodiment of the method according to the invention and for the device according to the method; instead, individual embodiment features of the exemplary embodiment can be freely combined with each other in any manner and can be combined with the above-described features.

Other features which are considered as characteristic for the invention are set forth in the appended claims.

Although the invention is illustrated and described herein as embodied in a method and a protection device for monitoring a circuit breaker in an electrical power supply network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
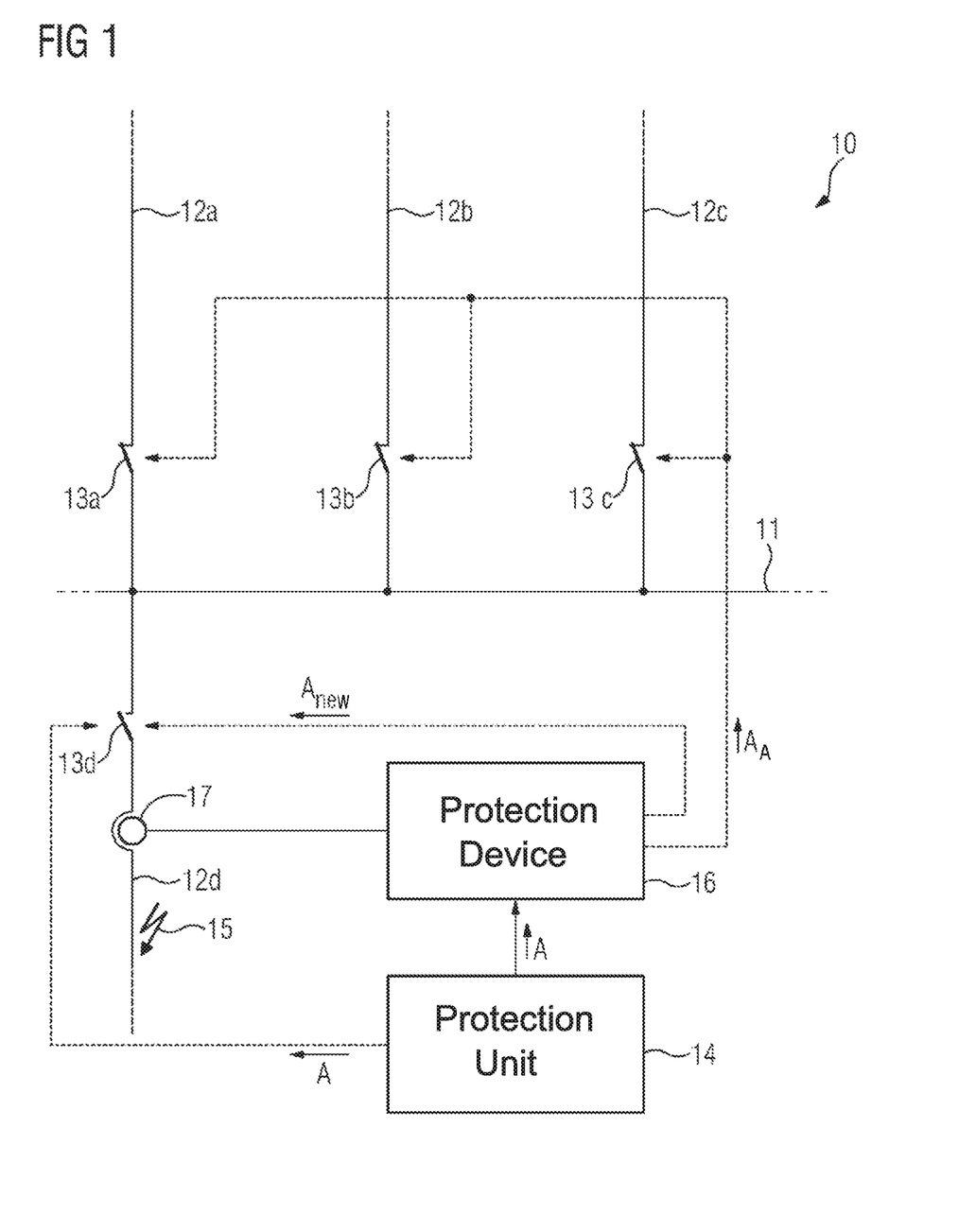
FIG. 1 is a schematic view of an electrical power supply network according to the invention.

Referring now to the figures of the drawings in detail and first, particularly to FIG. 1 thereof, there is shown a schematic representation of a part 10 of an electrical power supply network, which is otherwise not represented in greater detail. The part 10 contains a busbar 11 which is fed via three supply lines 12a-c. Circuit breakers 13a-c, via which the busbars 11 can be disconnected from the particular supply lines 12a-c, are situated in the supply lines. The busbar 11 is also supplied by a branch line 12d, which likewise can be disconnected from the busbar 11 via a circuit breaker 13d.

The branch line 12d is monitored for any faults which may occur, e.g., short circuits, by a protection unit 14 indicated merely schematically in FIG. 1. For this purpose, the protection unit picks up measured values, e.g., currents and voltages, characterizing an operating state of the branch line 12d at a measuring point which is not represented in FIG. 1 and evaluates the measured values by using so-called protection algorithms. Such protection algorithms can be, for example, an over current protection algorithm, a distance protection algorithm, or a differential protection algorithm. These protection algorithms are routine to a person skilled in the art in the field of monitoring electrical power supply networks and are not addressed here in greater detail.

If the protection unit 14 determines that the branch line 12d has a fault at a fault location 15 indicated by way of example, the protection unit 14 outputs a trigger signal A to the circuit breaker 13d in order to prompt the circuit breaker to open its switch contacts and therefore disconnect the branch line 13d from the busbar 11.

As a result, the current flowing at the fault location 15 is usually shut off and, therefore, the fault is cleared, and so fault elimination can be carried out. The operation of the remaining portion of the power supply network can continue in the meantime.

In exceptional cases it can occur, however, that the fault current is not shut off. This can occur, for example, due to a defect in the circuit breaker 13d or due to a faulty transmission of the trigger signal A. The proper functioning of the circuit breaker 13d having a protection device 16 is monitored in order to ensure the stability of the power supply network and the reliability of its operation in this case as well. This protection device 16 can either be an integral component of the protection unit 14 or can be configured as a separate device. The protection device 16 comprises a control device, e.g., a processor, for carrying out the monitoring. If the protection device 16 is a component of the protection unit 14, it can also access a processor of the protection unit 14 for this purpose.

In order to monitor whether the circuit breaker 13d has shut off properly, the protection device 16 investigates the current flowing across the circuit breaker 13d after the trigger signal A is output. For this purpose, the current is detected using a current transformer 17 and is fed to the protection device 16. One or multiple analog current signals is or are usually converted into digital measured current values using an ND converter for this purpose. In addition, further current-related preprocessing steps, e.g., calculating a ground current or a negative sequence system current, can be carried out. The measured current values which are examined can therefore be phase currents, a ground current (or a zero-phase sequence system current), or a negative sequence system current. In addition, the trigger signal A of the protection unit 14 is also fed to the protection device 16, in order to trigger the beginning of the circuit breaker monitoring.

If the protection device 16 detects a continuous current flow across the circuit breaker 13d after expiration of a maximum investigation period, the protection device deduces that there is a fault in the circuit breaker 13d and generates a switch-fault signal. This switch-fault signal can be used for outputting a new trigger signal $A_{new}$ to the circuit breaker 13d in order to make a second attempt to open the circuit breaker 13d. Alternatively or additionally, the switch-fault signal can also be used for outputting an auxiliary trigger signal $A_A$ to the circuit breakers 13a-c installed upstream from the circuit breaker 13d in order to open the circuit breakers and therefore shut off the fault. Since the entire busbar is switched off in this case, the local shutoff via the circuit breaker 13d is to be preferred and the shutoff via the circuit breakers 13a-c is to be used only in the event that the fault cannot be shut off via the circuit breaker 13d. It is therefore also possible to initially carry out a second attempt of the local shutoff via the circuit breaker 13d and to generate the auxiliary trigger signal only when the current flow across the circuit breaker 13d has also not been interrupted after expiration of a further time period.

The protection device 16 investigates the time curve of the instantaneous current for characteristic features in order to rapidly and reliably detect a successful interruption of the current flow across the circuit breaker 13d. Since the curve shape of the progression is therefore examined in the time range, a time-consuming transformation into the frequency range does not need to take place, and so the detection of a successful interruption can take place very rapidly.

In the investigation of the curve shape of the progression, the protection device 16 carries out an analysis as to whether certain criteria, which indicate a continuous current flow or an interrupted current flow, are present.

The specific criteria to be considered in the investigation are explained in greater detail in the following with reference to FIG. 2.

Figure 2:
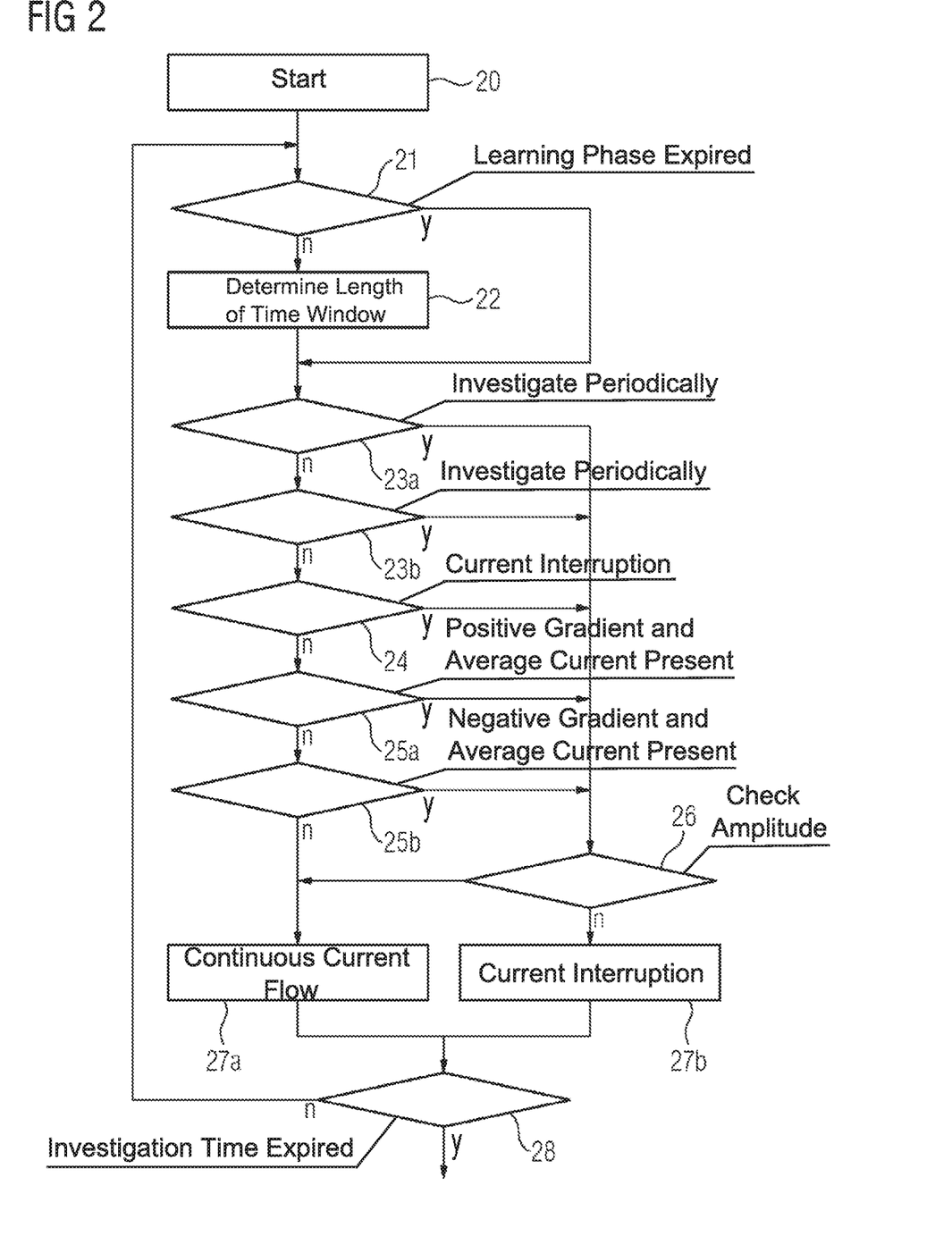
FIG. 2 is a flow chart of one exemplary embodiment of a method for monitoring a circuit breaker.

FIG. 2 shows a schematic flow chart which is provided for explaining the procedure for investigating the current flow across the circuit breaker 13d. Reference is additionally made to FIGS. 3 to 8 in respect of individual criteria. The method explained in association with FIG. 2 is usually implemented as software and is carried out by the control device. A hardware implementation in the form of an FPGA or an ASIC is also possible. The following comments relate to one possible exemplary embodiment of the method for circuit breaker monitoring. Within the scope of the invention, individual or multiple method steps can be added to those explained or can be omitted.

The method for circuit breaker monitoring shown by way of example in FIG. 2 is started in step 20. The activation of the method takes place upon receipt of the trigger signal A from the protection device 14 (see FIG. 1).

In a following step 21, a check is initially carried out to determine whether a duration of a learning phase has expired. The learning phase immediately follows the point in time at which the trigger signal A is output. The duration thereof is determined on the basis of the reaction time of the circuit breaker 13d, i.e., the time required by the circuit breaker 13d from the receipt of the trigger signal up to the opening of its switch contacts. If the duration of the learning phase has not yet expired, the method is continued at step 22; otherwise, the method jumps directly to step 23a.

In step 22, the length of the time window used for ascertaining the criteria described in the following is adaptively determined. The shortest possible length of the time window is utilized at the beginning. In subsequent runs of the method, the length of the time window is extended if necessary, depending on the result of the investigation. The determination of the length of the time window is explained in greater detail below in association with FIGS. 7 and 8.

In steps 23a and 23b, the criterion of the "periodicity" is investigated, i.e., a check is carried out to determine whether the curve shape of the progression of the instantaneous current has features of a periodic signal. A periodic progression is an indication of a continuous current flow and, therefore, an indication that the circuit breaker has not opened. Features which indicate a periodicity of a curve shape are, in particular, local extremes (maxima or minima) and inflection points.

Figure 3:
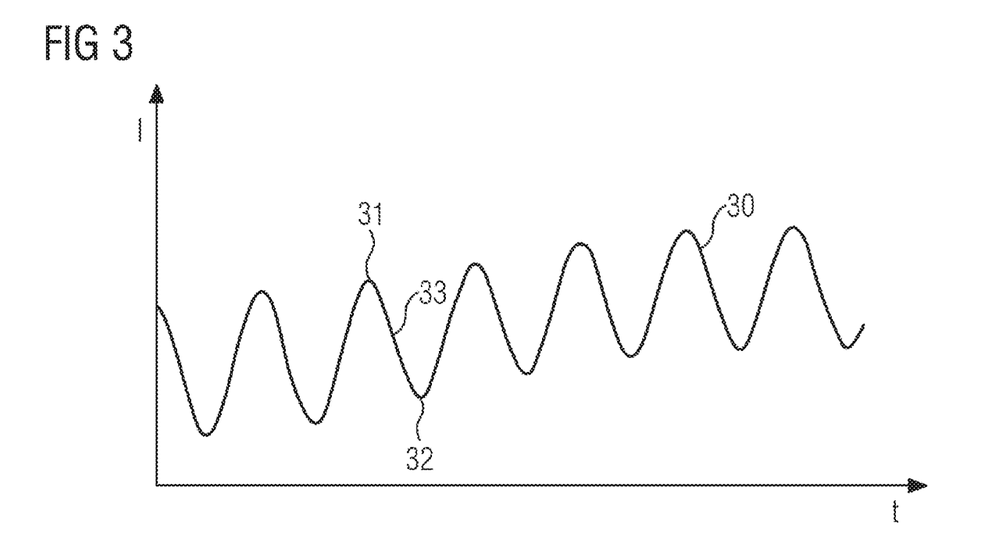
FIG. 3 is a current-time diagram, by way of example, for explaining the criterion "periodicity"

In the case of substantially sinusoidal curve shapes, which usually can be assumed in a progression of instantaneous currents in a power supply network, at least one local maximum 31, a local minimum 32, or an inflection point 33 always occurs in an examined time window having a length of at least one ¼ period of the fundamental mode to be detected (see the points entered on the curve 30 in FIG. 3 by way of example). The detection of these features can take place on the basis of the first and the second time derivatives of the progression of the instantaneous current or on the basis of the particular difference quotient.

Initially, for this purpose, the presence of local extremes is investigated in step 23a within the time window having the length selected in step 22. In a local extreme, the difference quotients of the first order (first derivative) located before and after the extreme have different signs. If such a change of signs is detected, the progression is considered to be periodic and the method jumps directly to step 26.

If a local extreme is not identified in step 23a, a check is then carried out in step 23b to determine whether an inflection point is present in the time window under consideration. For this purpose, the progression of the difference quotient of the second order (second derivative) is monitored. If a change of sign takes place in a difference quotient of the second order, this is a sufficient indication of an inflection point and the progression is considered to be periodic. In this case, the method jumps from step 23b directly to step 26.

In summary, the considered signal is considered to be periodic when at least one of the aforementioned features minimum, maximum or inflection point is detected. In this case, a further continuous current flow could be present. In the case of the opposite conclusion, a current-flow interruption is indicated when the signal does not have any features of periodicity.

If the curve does not have any features of periodicity (i.e., a current interruption could be present), the method is continued in step 24. Here, a check is carried out to determine whether a current interruption has already been determined in a previous run of the investigation. This can be detected, for example, on the basis of a "flag" assigned in the previous run of the method. If the present run is the first run or if a current interruption has not yet been determined, the investigation is continued with step 25a. Otherwise (a current interruption was previously determined), steps 25a and 25b are skipped and the method is continued directly with step 26. The check carried out in step 24 therefore has the purpose of tightening the method overall when indications of a current interruption exist. In such a case, it is sufficient to check the periodicity of the progression in steps 23a and 23b. If these steps do not indicate a restoration of the current flow, the following investigation steps 25a and 25b can be omitted from the present run. The check carried out in step 24 can relate to the immediately preceding investigation run, to a certain number of preceding investigation runs (e.g., the last three runs), or all preceding runs. The inspection algorithm must be adapted to the selection accordingly at this point.

In addition to the periodicity of the progression, the criterion of the presence of decay behavior is also an essential criterion, on the basis of which a decision can be reached as to whether the current flow is continuous or has been interrupted. Decay processes frequently occur after the current is shut off. Since these decay processes can be relatively high-current, the detection of the current decrease can be influenced and greatly delayed. These decay processes can be well managed using the criterion provided in the following, however, and do not result in a delay of the method, since the decay processes can be very easily identified using the aforementioned criteria and differentiated from other phenomena such as saturation.

Figure 4:
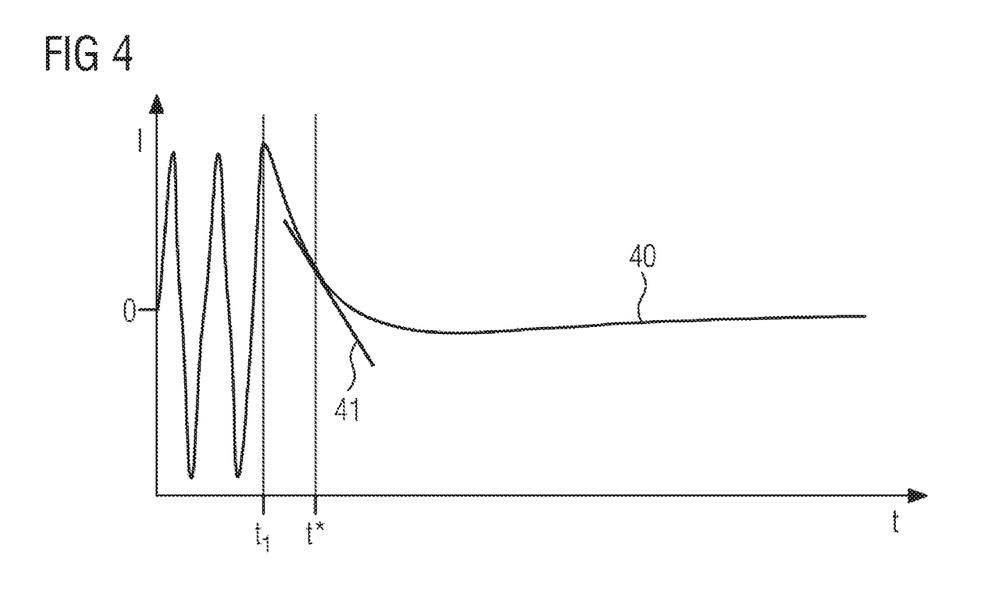
FIG. 4 is a further current-time diagram, by way of example, for explaining the criterion "decay behavior"

This is explained with reference to a progression 40 shown by way of example in FIG. 4. As of the point at which the switch contacts of the circuit breaker are opened at the point in time $t=t_1$, the progression 40 represented in FIG. 4 no longer has features of periodicity and it slowly decays. Such decay behavior indicates not only the fact that periodicity is lacking, but also that a current flow has been interrupted.

In order to enable the detection of decay behavior, the gradient of the progression must therefore be considered. If this gradient is permanently positive or negative in the time window under consideration, this is an indication of the presence of decay behavior. For this purpose, FIG. 4 shows, merely by way of example, the gradient 41 at the point in time $t=t^*$.

One difficulty associated with the general consideration of the gradient of the progression is that regions of the progression of the instantaneous current can occur, which are characterized by a permanently positive or negative gradient even in the case in which transformer saturation is present. This is illustrated in FIG. 5 by way of example.

Figure 5:
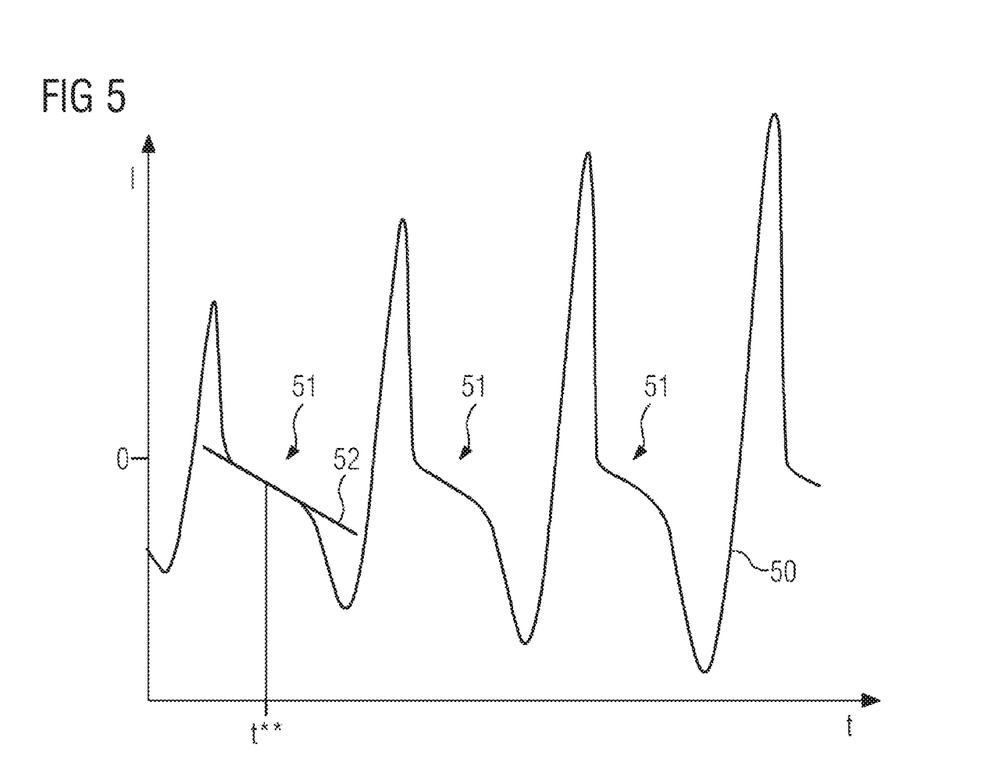
FIG. 5 is a further current-time diagram, by way of example, for explaining the detection of progressions influenced by transformer saturation.

The progression 50 represented in FIG. 5 shows a signal which is periodic per se and which, due to transformer saturation in certain regions (e.g., regions 51) does not have features of periodicity, but rather has a permanently negative gradient. The gradient 52 present at the point in time $t=t^{**}$ is shown by way of example. If the time window under consideration in the case of FIG. 5 does not include any of the present local extremes or an inflection point, the presence of decay behavior could be erroneously deduced if only the gradient were to be considered.

The criterion of the decay behavior is therefore supplemented with the feature that the presence of decay behavior may be deduced only when a negative gradient occurs in combination with an average current which is positive (as considered throughout the time window) or a positive gradient in combination with an average current which is negative. The average current is preferably calculated as an arithmetic mean in this case. As can be seen in the comparison of FIGS. 4 and 5, although such a case exists with the progression 40 in FIG. 4, a negative gradient and a negative average current do not both occur in the progression 50 in FIG. 5.

Therefore, in order to investigate the progression of the instantaneous current in step 25a, a check is initially carried out to determine whether a positive gradient is present together with a positive average current (in the time window under consideration). If this is the case, this indicates the presence of saturation and the method is continued at step 26. If the prerequisite of step 25a is not met, the method is continued in step 25 with the opposite check, namely whether a negative gradient is present together with a negative average current. If this is the case, this indicates the presence of saturation and the method is continued at step

26. If the prerequisite of step 25*b* is not met, the gradient and the average current must have different signs, which indicates the presence of decay behavior.

If steps 23*a* and 23*b* revealed no periodicity and steps 25*a* and 25*b* established the presence of decay behavior, it can be assumed that the current flow has been interrupted as desired. In step 27*a*, the decision is therefore reached for the present run of the investigation that the current flow has been interrupted, i.e., the circuit breaker has been opened. For this purpose, for example, a suitable flag can be set, which indicates an interruption of the current flow and is utilized in the further progression of the method (e.g., in step 28 or in a subsequent run in step 24). The investigation is then continued in step 28.

Step 26 is carried out when an indication of a continuous current flow was detected in one of the preceding checks. This is the case, in particular, if the progression is periodic or if decay behavior could not be determined. In step 26, an amplitude of the progression is ascertained and compared with an amplitude threshold value. In order to more easily ascertain the amplitude, this can be determined as the spacing between two consecutive local extremes (peak-to-peak amplitude). This is explained in greater detail in FIG. 6.

Figure 6:
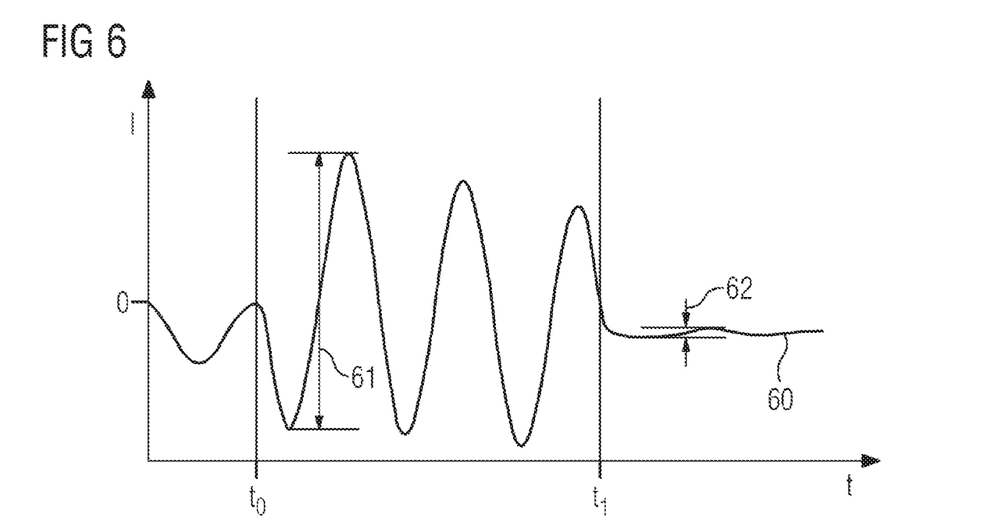
FIG. 6 is a further current-time diagram, by way of example, for explaining the criterion "amplitude"

FIG. 6 shows a progression 60 of an instantaneous current, by way of example. A fault occurs at the point in time $t=t_0$, which is shut off at the point in time $t=t_1$ by opening the switch contacts of the circuit breaker. A relatively great peak-to-peak amplitude 61 is apparent during the duration of the present fault; after the fault is shut off, the progression 60 has a peak-to-peak amplitude 62 which is significantly lower, however.

If the investigation of the peak-to-peak amplitude in the time window of the progression under consideration in step 26 therefore reveals that this amplitude lies below the amplitude threshold value, an interruption of the current flow is deduced and the method is continued at step 27*a* (see above).

According to the representation in FIG. 2, the criterion of the amplitude is depicted as prevailing over the periodicity criterion, i.e., an interruption is deduced even if indications of periodicity were detected. In this case, the amplitude criterion must be selected correspondingly strictly, i.e., a low threshold value must be specified, which indicates an interrupted current flow with great certainty. Other embodiments, in which the criteria of the periodicity and the amplitude are handled as equivalents, are also conceivable, however.

If it is determined in step 26, however, that the amplitude threshold value has not been fallen below, this is an indication not only of the presence of periodicity and the absence of decay behavior, but also a continuous current flow. In the subsequent step 27*b*, a continuous current flow is therefore detected and is labeled, for example, by assigning a suitable flag. The method is then continued at step 28.

In step 28, a check is carried out to determine whether the duration of the investigation time has expired. If this is the case, the method is terminated and the present decision as to whether a current interruption (step 27*a*) or a continuous current flow (step 27*b*) is present, is output. If a continuous current flow has been determined, the protection device generates the switch-fault signal (see FIG. 1). If the investigation time period has not yet expired, however, a new run of the method is started in step 21. In this case, the decision reached in steps 27*a* and 27*b* is transmitted, e.g., by setting the corresponding flag.

Finally, the procedure for adaptively determining the length of the time window (step 22) will be explained.

Figure 7:
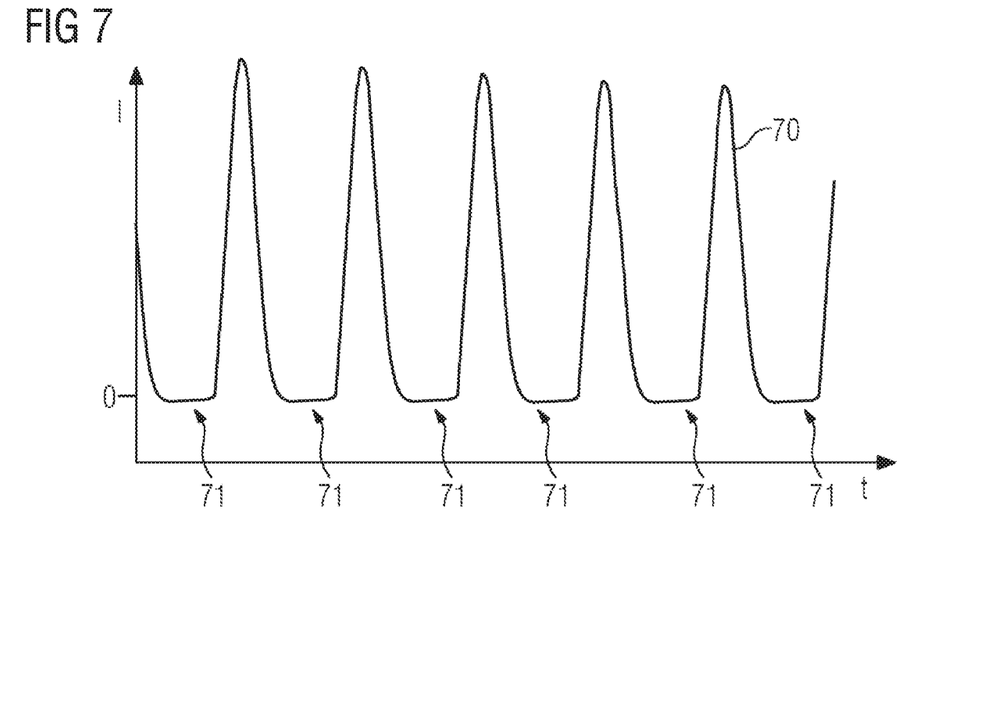
FIG. 7 is a further current-time diagram, by way of example, for explaining the detection of progressions influenced by overtones.

As can be seen in FIG. 7, cases can occur in which a progression of the instantaneous current—in certain ranges which can extend up to one-half of a period—neither shows signs of periodicity nor has an amplitude which lies above an amplitude threshold value. This can occur, in particular, when significant portions of harmonic overtones occur. For this purpose, FIG. 7 shows, by way of example, a progression 70 which has ranges 71—due to a superimposition with overtones—which are distinguished by the absence of periodicity and an amplitude close to zero. In accordance with the preceding explanations, if the length and position of the time window were unfavorable, this would indicate an interruption of the current flow, which, in reality, does not exist. The suitable selection of the length of the time window, in particular if overtones are present, is therefore decisive for a permissible implementation of the method for monitoring the circuit breaker. If overtones are absent, however, a static time window which was selected so as to be too long would delay the time up to the decision for an unnecessarily long period of time.

The time window is therefore adaptively adapted to the particularities of the progression. For this purpose, the investigation is carried out as represented in FIG. 2 during the learning phase immediately following the point in time at which the trigger signal is output. However, if an interruption of the current flow is detected during the learning phase, the time window is extended for the subsequent run of the method. This procedure is based on the consideration that an interruption of the current flow cannot occur during the learning phase, i.e., from the point in time at which the trigger signal is output up to the actual opening of the switch contacts of the circuit breaker, since the switch contacts have not been opened yet in this time period. If an interruption of the current flow is detected in the learning phase, this can therefore be due only to an unsuitable selection of the length of the time window. The length of the time window is therefore increased up to the point at which the results indicate a continuous current flow, as expected. After the end of the learning phase, the length of the time window is specified, since an interruption of the current flow can actually occur starting at this point. Typical values for the duration of the learning phase are approximately 1.5 periods.

Figure 8:
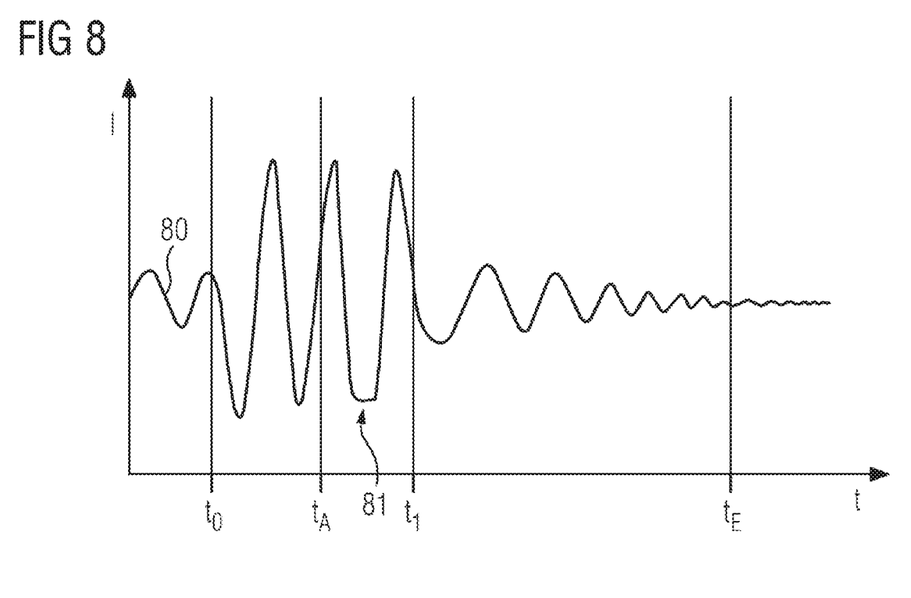
FIG. 8 is a current-time diagram, by way of example, for explaining the procedure for adaptively determining the length of a time window.

This procedure will now be illustrated briefly with reference to FIG. 8. FIG. 8 shows a progression 80 of an instantaneous current, by way of example. The occurrence of a fault is apparent at the point in time $t=t_0$, which fault is associated, inter alia, with an abrupt increase in the amplitude of the progression. At the point in time $t=t_A$, the protection algorithm of the protection device detects the presence of the fault and outputs the trigger signal A. The beginning of the learning phase is therefore specified. At the point in time $t=t_1$, the circuit breaker opens its switch contacts, whereby the end of the learning phase is specified. The duration of the learning phase is selected in dependence on the reaction time of the circuit breaker. This reaction time of the circuit breaker is usually a characteristic property of the circuit breaker and is indicated by the switch manufacturer in the technical data of the circuit breaker.

The learning phase contains a range of the progression 80, which is influenced by overtones and which could bring about the detection of an interruption of the current flow if the length of the time window was selected so as to be too short. Since the presence of a current flow interruption is ruled out for the learning phase, however, the time window is adaptively adapted by suitably increasing its length, as explained above. The specification of the length of the time window must be completed at the point in time $t=t_1$; starting at this point in time, both an interruption of the current flow and a continuous current flow can be detected.

The investigation time period has expired at the point in time $t=t_E$. If a continuous current flow has still been determined at this point in time, the switch-fault signal is generated, with the above-described consequences. In the example of FIG. 8, although a periodicity of the progression still exists, its amplitude continuously decreases and, at the end of the investigation time period, lies below the amplitude threshold value, and so an interruption of the current flow is detected and, therefore, a switch-fault signal is not generated.

Although the invention was illustrated and described above in greater detail by means of preferred exemplary embodiments, the invention is not restricted by the disclosed examples, and other variations can be derived therefrom by a person skilled in the art, without departing from the scope of protection of the following patent claims.

The invention claimed is:

1. A protective device for monitoring a circuit breaker in an electrical power supply network, comprising:
  a control device configured to:
    generate a switch-fault signal indicating a fault upon an opening of the circuit breaker if a continuous current flow through the circuit breaker is detected after a trigger signal for the circuit breaker is output;
    design the control device to investigate a curve shape of a time curve of an instantaneous current flowing through the contacts of the circuit breaker in respect of a presence of at least one criterion characterizing the curve shape, namely investigating a periodicity of a progression as the criterion, in order to detect the continuous current flow;
    deduce on a basis of the criterion, the continuous current flow or an interrupted current flow;
    deduce a continuity of a current flow through the circuit breaker when the periodicity of the progression is detected;
    investigate a decay behavior of the progression as one further criterion, in an absence of the periodicity of the progression, by:
      investigating a mean value of the progression of the instantaneous current through the contacts of the circuit breaker and a gradient of the progression of the instantaneous current in order to detect the decay behavior; and
      deducing, in a case of a positive mean value and a negative gradient or a negative mean value and a positive gradient, a presence of the decay behavior; and
    deduce an interruption of the current flow through the circuit breaker when the decay behavior of the progression is detected; and
    investigate the progression within a predefined time window, and a length of the predefined time window is adaptively determined.

2. A method for monitoring a circuit breaker in an electrical power supply network, which comprises the steps of:
  monitoring one section of the electrical power supply network for an occurrence of a fault;
  outputting, upon detection of the fault in a monitored section, a trigger signal to the circuit breaker bordering the monitored section;
  generating a switch-fault signal indicating the fault upon an opening of the circuit breaker if a continuous current flow through the circuit breaker is detected after the trigger signal is output;
  investigating a curve shape of a time curve of an instantaneous current flowing through the contacts of the circuit breaker in respect of a presence of at least one criterion characterizing the curve shape, namely investigating a periodicity of a progression as the criterion, to detect the continuous current flow;
  deducing on a basis of the criterion, the continuous current flow or an interrupted current flow;
  deducing a continuity of a current flow through the circuit breaker when the periodicity of the progression is detected;
  investigating a decay behavior of the progression as one further criterion, in an absence of the periodicity of the progression, the investigating step includes the substeps of;
    investigating a mean value of the progression of the instantaneous current through the contacts of the circuit breaker and a gradient of the progression of the instantaneous current in order to detect the decay behavior; and
    deducing, in a case of a positive mean value and a negative gradient or a negative mean value and a positive gradient, a presence of the decay behavior; and
  deducing an interruption of the current flow through the circuit breaker when the decay behavior of the progression is detected; and
  investigating the progression within a predefined time window, and a length of the predefined time window is adaptively determined.

3. The method according to claim 2, which further comprises investigating the periodicity of the progression on a basis of at least one of local extremes or inflection points which occur.

4. The method according to claim 2, which further comprises:
  investigating an amplitude of the progression as one further criterion; and
  deducing an interruption of the current flow through the circuit breaker when the amplitude of the progression falls below an amplitude threshold value.

5. The method according to claim 4, which further comprises determining the amplitude as a peak-to-peak amplitude of the progression.

6. The method according to claim 4, which further comprises deducing an interruption of the current flow in a case of the amplitude of the progression, which lies below the amplitude threshold value, when the periodicity of the progression has been detected.

7. The method according to claim 2, wherein:
  in order to adaptively determine the length of the predefine time window, an investigation is initially started with a minimum length of the predefined time window; and
  the length of the predefined time window is increased for as long as an interruption of the current flow is detected during a learning phase immediately following a point in time at which a shutoff signal is output, a duration of the learning phase is determined depending on a reaction time of the circuit breaker.

8. The method according to claim 2, which further comprises:
   carrying out an investigation of the curve shape of the progression repeatedly during an investigation period; and
   generating the switch-fault signal when the continuous current flow is determined at an end of the investigation period.

9. The method according to claim 8, wherein a selection of criteria to be considered for the investigation of the progression depends on whether an interruption of the current flow has already been detected in a previous run of the investigation.

10. The method according to claim 2, wherein if the switch-fault signal is present:
    outputting a new trigger signal to the circuit breaker; and/or
    outputting an auxiliary trigger signal to at least one further circuit breaker installed upstream from the circuit breaker.

* * * * *